United States Patent
Yuan et al.

(10) Patent No.: US 11,502,215 B2
(45) Date of Patent: Nov. 15, 2022

(54) AVALANCHE PHOTODIODE AND AN OPTICAL RECEIVER HAVING THE SAME

(71) Applicant: Hewlett Packard Enterprise Development LP, Houston, TX (US)

(72) Inventors: Yuan Yuan, Milpitas, CA (US); Di Liang, Santa Barbara, CA (US); Xiaoge Zeng, Milpitas, CA (US); Zhihong Huang, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 17/249,192

(22) Filed: Feb. 23, 2021

(65) Prior Publication Data

US 2022/0271186 A1 Aug. 25, 2022

(51) Int. Cl.
*H01L 31/107* (2006.01)
*H01L 31/02* (2006.01)
*H01L 31/0336* (2006.01)

(52) U.S. Cl.
CPC .... *H01L 31/1075* (2013.01); *H01L 31/02005* (2013.01); *H01L 31/0336* (2013.01)

(58) Field of Classification Search
CPC . H01L 31/107; H01L 31/1075; H01L 31/101; H01L 31/035272; H01L 31/035281; H01L 31/02027
See application file for complete search history.

(56) References Cited

U.S. PATENT DOCUMENTS 6,747,296 B1 6/2004 Clark
9,995,622 B2 6/2018 Williams
(Continued)

FOREIGN PATENT DOCUMENTS

CN 107505608 A * 12/2017 .......... G01S 7/4863
JP 2015046429 A * 3/2015

OTHER PUBLICATIONS

Benedikovic et al., "40 Gbps heterostructure germanium avalanche photo receiver on a silicon chip", Optica, vol. 7, No. 7, Jul. 2020, 9 pages.

(Continued)

*Primary Examiner* — Sitaramarao S Yechuri
(74) *Attorney, Agent, or Firm* — Hewlett Packard Enterprise Patent Department (57) ABSTRACT

Examples described herein relate to an avalanche photodiode (APD) and an optical receiver including the APD. The APD may include a substrate and a photon absorption region disposed on the substrate. The substrate may include a charge carrier acceleration region under the photon absorption region; a charge region adjacent to the charge carrier acceleration region; and a charge carrier multiplication region adjacent to the charge region. The charge carrier acceleration region, the charge region, and the charge carrier multiplication region are laterally formed in the substrate. When a biasing voltage is applied to the optoelectronic device, photon-generated free charge carriers may be generated in the photon absorption region and are diffused into the charge carrier acceleration region. The charge carrier acceleration region is configured to accelerate the photon-generated free charge carriers prior to the photon-generated free charge carriers entering into the charge region and undergoing impact ionization in the charge carrier multiplication region.

20 Claims, 5 Drawing Sheets

(56) References Cited

U.S. PATENT DOCUMENTS

| | | |
|---|---|---|
| 10,680,131 B2 | 6/2020 | Huang et al. |
| 2016/0300973 A1* | 10/2016 | Shen ................. H01L 31/03044 |
| 2020/0168756 A1 | 5/2020 | Rothman |

OTHER PUBLICATIONS

Huang et al., "25 Gbps low-voltage waveguide Si—Ge avalanche photodiode", Optica, vol. 3, No. 8, Aug. 2016, pp. 793-798.
Kwon et al., "Effect of Stochastic Dead Space on Noise in Avalanche Photodiodes",IEEE Transactions on Electron Devices, vol. 51, No. 5, May 2004, pp. 693-700.
Petticrew et al., "Simple Monte Carlo Simulator for Modelling Linear Mode and Geiger Mode Avalanche Photodiodes in C++", Journal of Open Research Software 6, 2018, 4 pages.
Ren et al., "AlInAsSb/GaSb staircase avalanche photodiode", Applied Physics Letters 108, 2016, 5 pages.
Srinivasan et al., "27 GHz Silicon-Contacted Waveguide-Coupled Ge/Si Avalanche Photodiode", IEEE Journal of Lightwave Technology 38, vol. 38, No. 11, 2020, pp. 3044-3050.
Sun et al., "High-Gain InAs Avalanche Photodiodes", IEEE Journal of Quantum Electronics, vol. 49, No. 2, Feb. 2013, pp. 154-161.
Wang et al., "Low-noise impact-ionization-engineered avalanche photodiodes grown on InP substrates", IEEE Photonics Technology Letters, Vo. 14, No. 12, Dec. 2002, pp. 1722-1724.
Yuan et al., "Temperature dependence of the ionization coefficients of InAlAs and AlGaAs digital alloys", Photonics Research, vol. 6, No. 8, Aug. 2018, 6 pages.
Yuan et al., "Triple-mesa avalanche photodiodes with very low surface dark current", Optics Express, vol. 27, No. 16, Aug. 5, 2019,7 pages.
Zhang et al., "64Gb/s PAM4 and 160Gb/s 16QAM modulation reception using a low-voltage Si—Ge waveguide-integrated APD", Optics Express, vol. 28, No. 16, Aug. 3, 2020, 8 pages.
Williams, G. M. et al.; "Multi-Gain-Stage InGaAs Avalanche Photodiode with Enhanced Gain and Reduced Excess Noise"; Feb. 2013; 12 pages.

* cited by examiner

AVALANCHE PHOTODIODE AND AN OPTICAL RECEIVER HAVING THE SAME

STATEMENT OF GOVERNMENT RIGHTS

This invention was made with Government support under DE-AR0001039 awarded by DOE, Office of ARPA-E. The Government has certain rights in this invention.

BACKGROUND

Devices such as optical receivers that convert an optical signal into an electrical signal generally include photosensitive devices, for example, photo-diodes. Optical receivers finds their applications in optical communication systems and any other systems that involve conversion of the optical signal into the electrical signal. The optical communication systems provide communication over longer distances with higher bandwidth using smaller cable width (or diameter) in comparison to communication systems using electrical wires. In the optical communication system, a light may be modulated by an optical transmitter and demodulated by an optical receiver that includes said photosensitive devices, for example.

BRIEF DESCRIPTION OF THE DRAWINGS

These and other features, aspects, and advantages of the present specification will become better understood when the following detailed description is read with reference to the accompanying drawings in which like characters represent like parts throughout the drawings, wherein.

It is emphasized that, in the drawings, various features are not drawn to scale. In fact, in the drawings, the dimensions of the various features have been arbitrarily increased or reduced for clarity of discussion.

DETAILED DESCRIPTION

The following detailed description refers to the accompanying drawings. Wherever possible, same reference numbers are used in the drawings and the following description to refer to the same or similar parts. It is to be expressly understood that the drawings are for the purpose of illustration and description only. While several examples are described in this document, modifications, adaptations, and other implementations are possible. Accordingly, the following detailed description does not limit disclosed examples. Instead, the proper scope of the disclosed examples may be defined by the appended claims.

The terminology used herein is for the purpose of describing particular examples and is not intended to be limiting. As used herein, the singular forms "a," "an," and "the" are intended to include the plural forms as well, unless the context clearly indicates otherwise. The term "another," as used herein, is defined as at least a second or more. The term "coupled," as used herein, is defined as connected, whether directly without any intervening elements or indirectly with at least one intervening element, unless indicated otherwise. For example, two elements may be coupled mechanically, electrically, or communicatively linked through a communication channel, pathway, network, or system. Further, the term "and/or" as used herein refers to and encompasses any and all possible combinations of the associated listed items. It will also be understood that, although the terms first, second, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

Devices such as optical receivers that convert an optical signal into an electrical signal generally include photosensitive devices, for example, photo-diodes. Optical receivers finds their applications in optical communication systems and any other systems that involve conversion of the optical signal into the electrical signal. The optical communication systems provide communication over longer distances with higher bandwidth using smaller cable width (or diameter) in comparison to communication systems using electrical wires. In the optical communication system, a light may be modulated by an optical transmitter and demodulated by an optical receiver that includes said photosensitive devices, for example. Examples of the photodiodes that may be used in the optical receivers may include, but are not limited to, PN photodiode, PIN photodiode, avalanche photodiodes, and Schottky photodiode.

The growth of data traffic in optical communication systems has led to the development of high speed, low energy, and cost effective optical interconnects that include optical receivers. In such applications demanding high data speeds and low energy consumption, high sensitivity optical receivers are beneficial to reduce the emission power required at the transmitter end, which effectively lowers the link power budget. Generally, the avalanche photodiodes (APDs) have good sensitivity to impinging light and provide good gain. An avalanche photodiode (APD) is a photodetector that is made from one or more semiconductor materials. Typically, certain known structures of APD include separate absorption region, charge region, and multiplication regions. A structure of the APD with such separate absorption region, charge region, and multiplication regions is hereinafter referred to as an SACM structure.

The APDs are operated with an application of a reverse bias voltage, which is typically of the order of tens or hundreds of volts. Sometimes, the APDs may be operated just below a breakdown voltage. An APD when operated by applying the reverse bias voltage, a semiconductor material of the photon absorption region absorbs light that causes generation of charge carriers (hereinafter referred to as photon-generated charge carriers). The photon-generated charge carriers enter into the multiplication region through the charge region. The operation of the APD at high reverse bias voltages causes an avalanche multiplication of the holes and electrons in the multiplication region. For example, when the avalanche photodiode is operated at certain levels of the reverse bias voltage, charge carriers in the multiplication region such as electrons and holes may be excited by existence of a strong internal electric field caused by the applied reverse bias voltage in the multiplication region. The excited carriers gain sufficient energy due to the strong internal electric field and can free-up several other charge carriers. Such process of generating the charge carriers by the excited charge carriers due to the strong internal electric field is also referred to as an impact ionization. The impact ionization caused by high electric field amplifies the photocurrent by a significant factor resulting in increased internal gain, which makes the APD a suitable choice for applications demanding high sensitivity. In the description hereinafter, the terms "gain," "multiplication gain," and "internal gain" have been used interchangeably and represent a ratio of multiplied photocurrent to a primary un-multiplied photocurrent of the APD. In some examples, the terms "gain," "multiplication gain," and "internal gain" may also be expressed as a number of multiplied electron-hole pairs caused by one original electron-hole pair that has initiated the impact ionization.

As it is apparent that the process of impact ionization is a stochastic process that includes a noise, which causes fluctuations in a gain (also referred to as a multiplication gain), provided by the APDs. Such noise is referred to as an excess noise of the APDs and is described by an excess noise factor. The excess noise factor is a function of a multiplication gain M, and a ratio k (hereinafter referred to as k-value) of an ionization coefficient of holes to an ionization coefficient of electrons. Presence of the excess noise in an APD reduces accuracy of signal detection by the APD and thus reduces sensitivity of an optical receiver having the APD.

In past, efforts have been made to reduce the k-value to achieve higher sensitivity, for example, by using low k-value semiconductor materials and/or modifying structures of the APDs. For example, in some implementations of the APDs having the SACM structure, low k-value materials such as Silicon (Si) or Indium aluminum arsenide (InAlAs) or digital alloys have been used. For example, germanium on silicon (Ge/Si) APDs having SACM structure typically include Si as the multiplication layer. Further, Indium gallium arsenide (InGaAs) on InAlAs (InGaAs/InAlAs) SACM APD uses InAlAs as the multiplication layer. Due to the low k-value of Si and InAlAs, the Ge/Si APDs and the InGaAs/InAlAs APDs exhibit low excess noise, high bandwidth, high sensitivity, and high gain-bandwidth product (GBP). Further, in some implementations, a structure of an APD is modified to reduce the k-value, for example, an APD with reduced thickness may demonstrate a dead space effect causing reduction in the k-value. Further, in some examples, an impact ionization engineered APD having a heterojunction structure with different ionization threshold energies may be formed which also reduces the k-value. Moreover, in some examples, an APD with a staircase structure (hereinafter referred to as a staircase APD) with band discontinuities may be formed, resulting in the reduction of the k-value.

The above-mentioned solutions have their respective challenges. For example, the solutions requiring the low k-value materials are limited by use of the specific materials, such as, InAs and/or digital alloys. Further, for the APDs exhibiting the dead space effect, a thin multiplication layer is prerequisite. As will be understood, use of the thin multiplication layer entails an extremely high electric field to achieve certain gain. Use of such high electric fields leads to generation of very high dark current and poor reliability of such APD. The term "dark current" may refer to an unwanted excess leakage current of the APD when the APD is reversed biased and is not exposed to light. Furthermore, for the impact ionization engineered and/or the staircase APDs, a heterogeneous material system is needed to tune a band structure. This kind of material system requires materials with a wide range of bandgap that are hard to form, complex, and expensive.

To that end, in accordance with aspects of the present disclosure, an optoelectronic device, for example, an APD having a new structure is presented. The proposed APD has a structure that reduces excess noise and is independent of the material limitations of the known solutions. The proposed APD has a lateral structure with separate photon absorption, charge carrier acceleration, charge, and charge carrier multiplication regions (hereinafter referred to as an SAACM structure). In one implementation, the APD includes a substrate and a photon absorption region disposed on the substrate. The substrate includes a charge carrier acceleration region under the photon absorption region; a charge region adjacent to the charge carrier acceleration region; and a charge carrier multiplication region adjacent to the charge region. The charge carrier acceleration region, charge region, and the charge carrier multiplication region are laterally formed in the substrate.

During operation of the APD, when a biasing voltage is applied to the APD and when light impinges on the APD, charge carriers may be generated in the photon absorption region (hereinafter referred to as photon-generated charge carriers). The photon-generated charge carriers may diffuse from the photon absorption region to the charge carrier acceleration region. Further, due to a non-zero electric field in the charge carrier acceleration region, the photon-generated charge carriers may obtain an initial momentum and be accelerated in the charge carrier acceleration region. After gaining such initial acceleration, the photon-generated charge carriers may enter into the charge carrier multiplication region via the charge region. Since the photon-generated charge carriers have already obtained energy in charge carrier acceleration region, it becomes easier for the photon-generated charge carriers to attain an ionization threshold energy in the charge carrier multiplication region. As a result, the impact ionization events may be concentrated in the charge carrier multiplication region. In particular, in the proposed APD, the process of imparting acceleration to the photon-generated charge carriers and causing impact ionization by the already accelerated photon-generated charge carriers is carried out in two separate regions, for example, the charge carrier acceleration region and the charge carrier multiplication region, respectively. That is, the photon-generated charge carriers are first accelerated in the charge carrier acceleration region and initiate impact ionization in the charge carrier multiplication region. In sharp contrast, in the traditional solutions, the effects causing avalanche process, for example, energy/momentum gain and impact ionization are caused within a same region. Carrying-out both these processes in a common region leads to randomness and generation of excess noise.

Advantageously, in the proposed APD, the photon-generated charge carriers are first accelerated in the charge carrier acceleration region and initiate impact ionization locally in the charge carrier multiplication region. The localized impact ionization in the charge carrier multiplication region caused due to the geometry of the charge region (described later), reduces randomness and, hence suppresses the excess noise. Due to reduction of the excess noise, the proposed APD is more sensitive to incoming optical signals in comparison to the traditional solutions. In other words, in some examples, an optical receiver that uses the APD can sense optical signals with lower intensities comparison to the traditional solutions. Accordingly, optical transmitters can be designed to emit optical signals with reduced intensities. Therefore, in some examples, use of the APD in an optical communication system may reduce a link power cost/budget.

Further, in some examples, the proposed structure of APD is suitable with several semiconductor materials. For example, in comparison to impact ionization engineered APDs and the staircase APDs that uses materials with specific and/or modified band structures, the proposed APD is not limited by such band structure requirements. Moreover, the proposed APD may further reduce the excess noise if the charge carrier multiplication region is made of a low k-value material. Furthermore, the proposed structure of APD can be easily applied on current silicon photonics platforms. Further, use of the charge carrier acceleration region in the APD avoids the impact ionization to happen in the photon absorption region. Moreover, special structures of the charge region and the second contact region causes the electric field to remain confined in the charge carrier multiplication region. Such electric field distribution of the electric field reduces dark current in the APD. The proposed APD with lower excess noise and reduced dark current provide improvement for various other applications including LiDAR, integrated quantum photonics, and quantum key distribution. Moreover, the lateral structure of the proposed APD enables an easy way to change the shapes of the various regions including contact regions, charge carrier multiplication region, charge carrier acceleration region, and the charge region by controlling doping process.

Figure 1A:
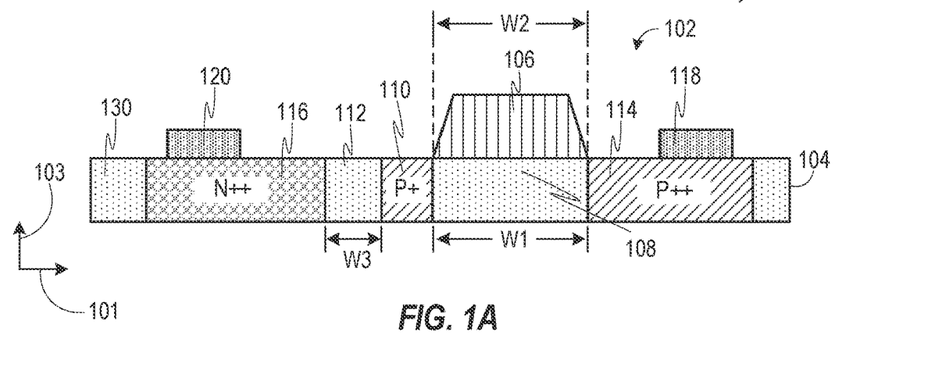
FIG. 1A depicts a cross-sectional view of an avalanche photodiode (APD), in accordance with an example.
Figure 1B:
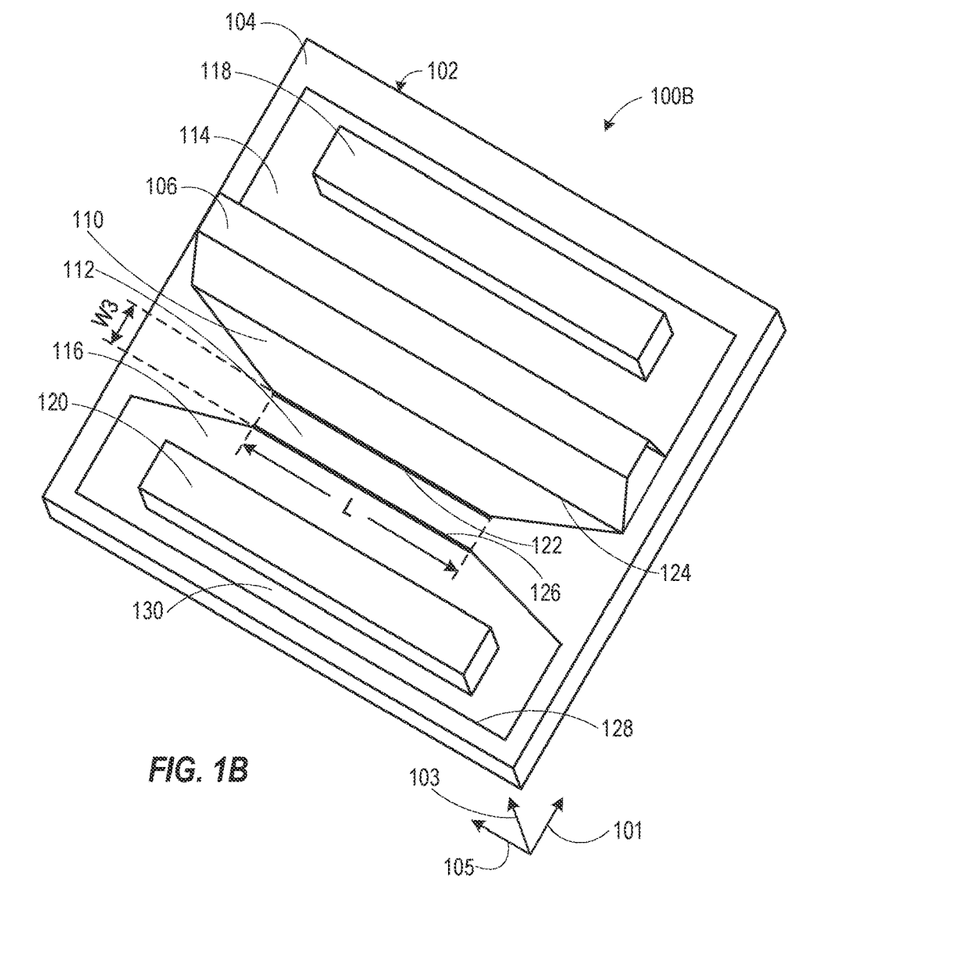
FIG. 1B depicts a perspective view of the APD of FIG. 1A, in accordance with an example.
Figure 1C:
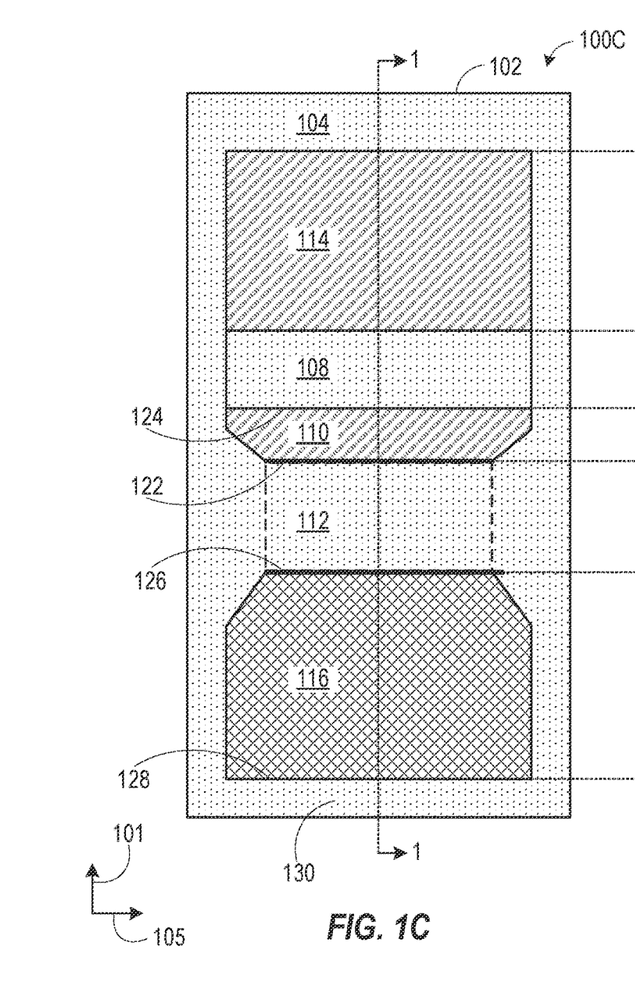
FIG. 1C depicts a top view of the APD of FIG. 1A, in accordance with an example.
Figure 2:
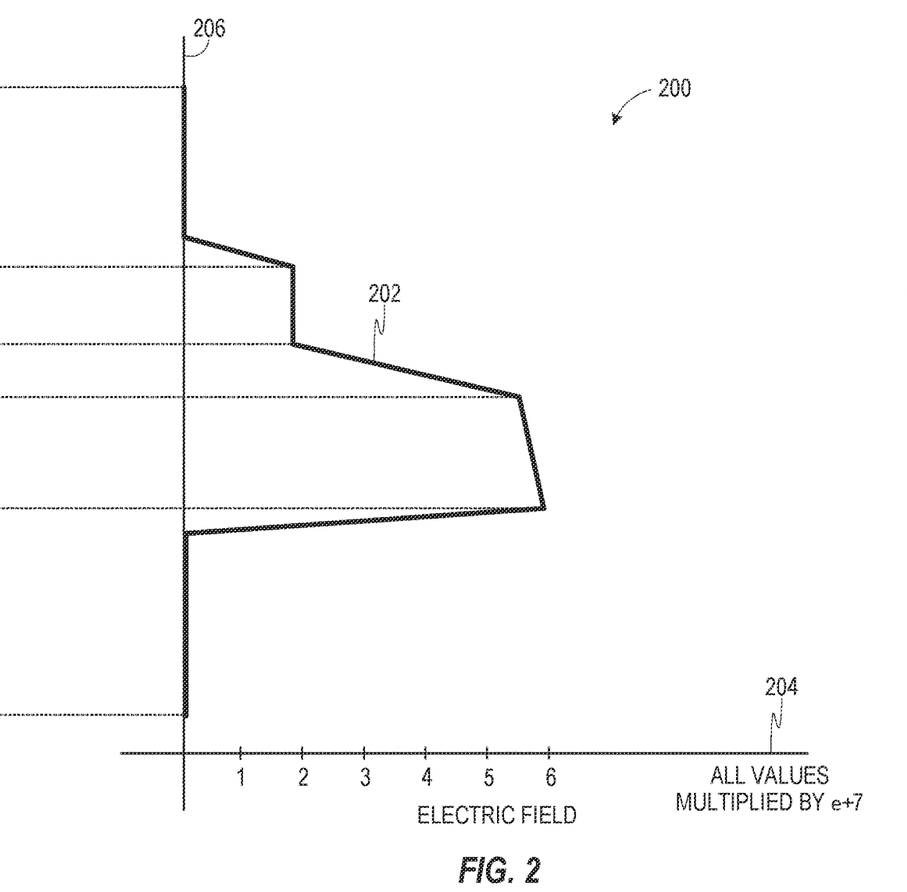
FIG. 2 depicts a graphical representation showing an electric field distribution across various regions of the APD of FIG. 1A, in accordance with an example.

Referring now to the drawings, in FIG. 1A, a cross-sectional view 100A of an avalanche photodiode (APD) 102 is presented, in accordance with an example. Further, FIG. 1B and FIG. 1C depict a perspective view 100B and a top view 100C, respectively, of the APD 102 of FIG. 1A, in accordance with an example. Further, FIG. 2 depicts a graphical representation 200 showing an electric field distribution across the APD 102 of FIG. 1A, in accordance with an example. In the description hereinafter, FIGS. 1A-1C and 2 will be referenced concurrently for ease of illustration. In particular, the cross-sectional view 100A may represent a cross-section of the APD 102 at position 1-1 marked in the top view 100C of FIG. 1C. Further, in FIGS. 1A-IC, a lateral direction, a vertical direction, and a longitudinal direction are shown using arrows 101, 103, and 105, hereinafter referred to as a lateral direction 101, a vertical direction 103, and a longitudinal direction 105. In some examples, the lateral direction 101, the vertical direction 103, and the longitudinal direction 105 may be oriented at a non-zero angle from each other. In some other examples, the lateral direction 101, the vertical direction 103, and the longitudinal direction 105 may be orthogonal to each other. The terms 'laterally,' 'vertically,' and 'longitudinally' may respectively interpreted as "along the lateral direction 101," "along the vertical direction 103," and "along the longitudinal direction 105." Further, a dimension of a given region along the lateral direction 101 is referred to as a width or a thickness. Furthermore, a dimension of a given region along the longitudinal direction 105 is referred to as a length. Moreover, a dimension of a given region along the vertical direction 103 is referred to as a height.

The APD 102 may be a semiconductor device having a lateral structure of one or more regions as described hereinafter. As depicted in FIGS. 1A-1C, in some examples, the avalanche photodiode (APD) 102 may include a substrate 104 and a photon absorption region 106 disposed on the substrate 104. In particular, the photon absorption region 106 may be formed vertically on the substrate 104. In some examples, the substrate 104 is made of a first semiconductor material and the photon absorption region 106 is made of a second semiconductor material that is different from the first semiconductor material. Examples of the first semiconductor material used to form the substrate 104 may include, but are not limited to, Silicon (Si), Indium phosphide (InP), Indium aluminum arsenide (InAlAs), Aluminum gallium arsenide (AlGaAs), or combinations thereof. Further, examples of the second semiconductor material used to form the photon absorption region 106 may include, but are not limited to, Indium gallium arsenide (InGaAs), Germanium (Ge), or Gallium arsenide (GaAs), Silicon (Si), or combination thereof. In one example implementation, the photon absorption region 106 may be made of Ge and the substrate 104 may be made of Si. In another example implementation, the photon absorption region 106 may be made of InGaAs and the substrate 104 may be made of InP. In another example implementation, the photon absorption region 106 may be made of InGaAs and the substrate 104 may be made of InAlAs. In another example implementation, the photon absorption region 106 may be made of GaAs and the substrate 104 may be made of InGaAs. In yet another example implementation, the photon absorption region 106 may be made of InGaAs and the substrate 104 may be made of Si. Although not listed hereinabove, other material combinations of the photon absorption region 106 and the substrate 104 may also be possible, without limiting the scope of the present description.

For ease of illustration, in the example APD 102 shown in FIG. 1A, the substrate 104 and the photon absorption region 106 are respectively made of Si and Ge. In particular, in certain examples, the photon absorption region 106 may be un-doped semiconductor material. Further, the photon absorption region 106 is shown as a trapezoidal block (see FIG. 1B) which is resulted due to a deposition of the material forming the photon absorption region 106 and may have a trapezoidal cross-section (see FIG. 1A) for illustration purposes. The photon absorption region 106 may be formed of any suitable shape and/or size without limiting the scope of the present disclosure. Moreover, the photon absorption region 106 may be formed on the substrate 104 using techniques including but not limited to, chemical vapor deposition, cyclic thermal annealing, epitaxial growth, and the like.

In some examples, the first semiconductor material has a wider energy bandgap in comparison to an energy bandgap of the second semiconductor material. Such a selection of materials enhances photon absorption in the photon absorption region 106. Typically, a weak optical signal (e.g., light with low intensity) has longer wavelength in comparison to strong or good optical signals (e.g., light with high intensity). The long wavelength signals have reduced energy photons in comparison to photons of the short wavelength signals. Use of the photon absorption region 106 made of the second semiconductor material that has narrower energy bandgap may free-up the charge carriers (e.g., electrons) in the photon absorption region 106 even when such weak optical signal impinges on the APD 102. In particular, the photons when impinge on the photon absorption region 106 excite electrons from respective valance bands. The excited electrons enter into the conduction band from the valance band by absorbing the energy of the impinging photons. Electrons that have entered into the conduction band due to the energy of the impinging photons are hereinafter referred to as photon-generated charge carriers or photon-generated electrons.

Further, in some examples, the substrate 104 may include a charge carrier acceleration region 108 (hereinafter referred to as acceleration region 108), a charge region 110, and a charge carrier multiplication region 112 (hereinafter referred to as multiplication region 112). Additionally, in some examples, the substrate 104 may also include contact regions, such as, a first contact region 114 and a second contact region 116. In particular, as shown in FIG. 1A, in some examples, the acceleration region 108, the charge region 110, the multiplication region 112, and the contact regions 114, 116 are be formed laterally, e.g., along the lateral direction 101, in the substrate 104. For example, acceleration region 108, the charge region 110, the multiplication region 112, and the contact regions 114, 116 may be formed in side-by-side manner along the lateral direction 101 as depicted in FIG. 1. In particular, the acceleration region 108 may be formed vertically under the photon absorption region 106. In some examples, the acceleration region 108 and the photon absorption region 106 may be formed such that a width W1 of the acceleration region 108 may be same as a width W2 of the photon absorption region 106. This may maximize the number photon-generated charge carriers that can enter into the acceleration region 108. The acceleration region 108 is un-doped semiconductor material, for example, an un-doped portion of the substrate 104. In other words, the acceleration region 108 (or in fact the substrate 104) may be formed of a semiconductor material that has higher energy band gap in comparison to the energy band gap of the photon absorption region 106. Accordingly, upon application of biasing voltage (described later) to the APD 102, there exists a non-zero electric field across the acceleration region 108. In particular, there may exist higher electric field across the acceleration region 108 in comparison to the photon absorption region 106, which aids in imparting initial acceleration to the photon-generated charge carriers. In particular, such relative higher electric field of the acceleration region 108 attracts the photon-generated charge carriers from the photon absorption region 106. Such attraction resulted due to the higher electric field of the acceleration region 108 causes the photon-generated charge carriers to accelerate prior to entering into the charge region 110.

The charge region 110 may be formed adjacent to the acceleration region 108. In some examples, the charge region 110 may be formed immediately adjacent to the acceleration region 108. For illustration purposes, in the example of FIG. 1A, the charge region 110 is shown as formed adjacent to the acceleration region 108 on a first side (e.g., left side) of the acceleration region 108. In some other examples, the charge region 110 may be formed on a second side (e.g., the right side) opposite to the first side of the acceleration region 108. The charge region 110 may be formed by doping certain impurities (described later) into a respective designated region of the substrate 104. Moreover, the multiplication region 112 may be located adjacent to the charge region 110. In particular, the multiplication region 112 is a region of un-doped semiconductor material, for example, an un-doped portion of the substrate 104. As such, the multiplication region 112 is located such that the charge region 110 is laterally sandwiched between the multiplication region 112 and the acceleration region 108 as depicted in FIG. 1A.

Furthermore, in some examples, the contact regions 114 and 116 may be formed on either sides of the substrate 104. For example, the first contact region 114 may be formed adjacent to the acceleration region 108 and the second contact region 116 may be formed adjacent to the multiplication region 112. In particular, in one example, the first contact region 114 may be formed adjacent to a boundary of the acceleration region 108 such that the acceleration region 108 is laterally sandwiched between the first contact region 114 and the charge region 110. Further, in one example, the second contact region 116 may be formed adjacent to a boundary of the multiplication region 112 such that the multiplication region 112 is laterally sandwiched between the second contact region 116 and the charge region 110. The first contact region 114 and the second contact region 116 may be formed by doping respective impurities into respective designated regions of the substrate 104.

The first contact region 114 may include a first-type doping and the second contact region 116 may include a second-type doping. The charge region 110 may include either the first-type doping or the second-type doping. In one example, the first-type doping may be p-type doping and the second-type doping may be n-type doping. In another example, the first-type doping is n-type doping and the second-type doping is p-type doping. For illustration purposes in the rest of the description, the first-type doping is described as being p-type doping and the second-type doping is described as being n-type doping. Accordingly, in the example of FIG. 1A, the first contact region 114 and the charge region 110 are shown to include p-type doping and the second contact region 116 is shown to include n-type doping.

N-type doping may be achieved by doping the substrate 104 with impurities having donor ions including, but not limited to, Phosphorus (P), Arsenic (As), Antimony (Sb), or Bismuth (Bi). Accordingly, the semiconductor material with n-type doping may have electrons in excess of holes. P-type doping may be achieved by doping the substrate 104 with impurities having acceptor ions including, but not limited to, Boron (B), Gallium (Ga), Indium (In), or Aluminum (Al). Accordingly, the semiconductor material with p-type doping may have holes in excess of electrons. N-type doping or p-type doping may be achieved by using techniques such as impurity diffusion, ion implantation, in-situ doping, or the like. Further, in some examples, the doping of the first contact region 114, the second contact region 116, and the charge region 110 may be performed such that the first contact region 114 and the second contact region 116 may have higher concentration of respective doping in comparison to a doping concentration in the charge region 110. Accordingly, the first contact region 114 and the second contact region 116 are highly doped and are marked with labels "p++" and "n++" respectively, whereas the charge region 110 may not be highly doped and is marked with "p+."

In some examples, the charge region 110 and the second contact region 116 may be formed such that the charge region 110 and the second contact region 116 tapers toward each other. In particular, boundaries of the charge region 110 and the second contact region 116 that are oriented toward each other (e.g., facing each other) have reduced lengths (e.g., a dimension along the longitudinal direction 105) in comparison to respective opposite boundaries. For example, the charge region 110 has a first boundary 122 and a second boundary 124 that is opposite to the first boundary 122. In particular, the first boundary 122 of the charge region 110 is adjacent to the multiplication region 112 whereas the second boundary 122 of the charge region 110 is adjacent to the acceleration region 108. Similarly, the second contact region 116 has a first boundary 126 and a second boundary 128 that are opposite to each other. In particular, the first boundary 126 of the second contact region 116 is adjacent to the multiplication region 112 whereas the second boundary 128 of the second contact region 116 is adjacent to a region 130 of the substrate 104. In particular, the first boundaries 122, 126 and the second boundaries 124, 128 represent boundaries of the charge region 110 and the second contact region 116 along the longitudinal direction 105 (see FIG. 1C).

As depicted in FIGS. 1B and 1C, the charge region 110 and the second contact region 116 are dimensioned such that the first boundaries 122 and 126 (shown thicker in comparison to the second boundaries 124 and 128 for easier identification) are shorter than the second boundaries 124 and 128, respectively. In particular, the lengths (L) of the first boundaries 122 and 126 and a distance (W3) between the first boundaries 122 and 126 determines the dimensions of the multiplication region 112. For example a length of the multiplication region 112 may be similar to the lengths (L) of the first boundaries 122 and 126 and a width of the multiplication region 112 may be same as the distance (W3) between the first boundaries 122 and 126. For easy identification, the multiplication region 112 is marked with a dashed outline in the perspective view 100B shown in FIG. 1B and the top view 100C shown in FIG. 1C. It may be noted to that for illustration purposes, the photon absorption region is not depicted in the top view 100C shown in FIG. 1C. Such a dimensions of the charge region 110 and the second contact region 116 cause, during the operation of the APD, an electric field to be concentrated in the multiplication region 112 (see FIG. 2). In particular, the multiplication region 112 may have higher electric field in comparison to regions of the substrate 104 outside of the multiplication region 112. Such an electric field distribution in the multiplication region 112 avoids electric field crowing at the edges of the substrate 104 and reduces the active multiplication area (i.e., an area where impact ionization can occur) resulting in reduced excess noise and dark current of the APD 102.

Moreover, in some examples, the APD 102 may also include metal contacts, such as, a first metal contact 118 and a second metal contact 120. As depicted in FIG. 1A, the first metal contact 118 and the second metal contact 120 respectively disposed in electrical contact with the first contact region 114 and the second contact region 116. Examples of materials used to form the metal contacts 118, 120 may include, but are not limited to, Gold (Au), Al, Platinum (Pt), and the like.

To operationalize the APD 102, a biasing voltage (e.g., a reverse bias voltage) may be applied to the APD 102 across the first contact region 114 and the second contact region 116 via the metal contacts 118, 120. The biasing voltage may be derived from a voltage source such as a battery (not shown) and/or one or more electrical contacts in a circuitry (not shown) of a system (e.g., an optical receiver). The APD 102 may be connected to the voltage source such that the APD 102 is reverse biased. In particular, the example APD 102 depicted in FIG. 1A may be reverse biased when a negative voltage is applied to the first metal contact 118 and a positive voltage is applied to the second metal contact 120. It may be noted that the terms "positive voltage" and the "negative voltage" are relative voltages. In other words, a given metal contact of the two metal contacts 118, 120 is said to be at the positive voltage when a potential at the given metal contact is greater than a potential at the other metal contact of the two metal contacts 118, 120. Similarly, the given metal contact of two metal contacts 118, 120 is said to be at the negative voltage when the potential at the given metal contact is lower than the potential at the other metal contact of the two metal contacts 118, 120.

When a biasing voltage is applied to APD 102, an electric field may appear across first contact region 114, the acceleration region 108, the charge region 110, and the multiplication region 112, and the second contact region 116 with varying magnitudes. An example electric field distribution across various regions of the APD 102 is depicted in FIG. 2. For better understanding of the electric field distribution, FIG. 2 is depicted alongside the top view 100C of FIG. 1C. Referring now to FIG. 2, a graphical representation 200 depicting an electric field distribution 202 is presented. The example electric field distribution 202 may be achieved at the position 1-1 marked in the top view 100C when the APD 102 is reversed biased by applying potential difference across the metal contacts 118, 120.

In the graphical representation 200 of FIG. 2, reference numerals 204 and 206 respectively represent an X-axis and a Y-axis. The X-axis 204 represents a magnitude of the electric (measured in volts/meter) field and the Y-axis 206 represents various regions of the APD 102 (for illustration purposes mapped to the regions shown in the top view 100C of the APD 102 shown in FIG. 1C). It may be noted to that for illustration purposes, the photon absorption region is not depicted in the top view 100C shown in FIG. 1C. In some other examples, the APD 102 may be operated in the reverse biased manner by applying a potential difference of any magnitude at which impact ionization may be effected in the multiplication region 112, without limiting the scope of the present disclosure. In the graphical representation 200, it is observed that the contact regions 114, 116 have negligible (e.g., zero or near zero) electric fields. Further, the multiplication region 112 has the highest electric field and the acceleration region 108 has lower electric field in comparison to the multiplication region 112, whereas the charge region 110 exhibits an electric field gradient. Accordingly, in some examples, one or both of the doping concentration or the thickness of the charge region 110 may be adjusted to set magnitudes of electric fields of the acceleration region 108 and the multiplication region 112. For example, an increase in the thickness of the charge region 110 causes lowering of the level/magnitude of the electric field in the acceleration region 108, and vice-versa.

During operation of the APD 102, when light impinges on the APD 102, charge carriers (e.g., free electrons and holes, also referred to as photon-generated charge carriers) may be generated in the photon absorption region 106. The photon-generated charge carriers diffuse from the photon absorption region 106 to the acceleration region 108. Further, due to the electric field in the acceleration region 108, the photon-generated charge carriers may obtain an initial momentum and accelerate in the acceleration region 108. After gaining such initial acceleration, the photon-generated charge carriers may enter into the multiplication region 112 via the charge region 110. Since the photon-generated charge carriers have already obtained energy in acceleration region 108, it becomes easier for the photon-generated charge carriers to attain an ionization threshold energy in the multiplication region 112. A band structure of the APD 102 and a process of impact ionization is described in further details in conjunction with FIG. 3. As a result, the impact ionization events may be concentrated in the thin multiplication region 112. In particular, in the proposed APD 102, the process of imparting acceleration to the photon-generated charge carriers and causing impact ionization by the already accelerated photon-generated charge carriers is carried out in two separate regions, for example, the acceleration region 108 and the multiplication region 112, respectively. That is, the photon-generated charge carriers are first accelerated in the acceleration region 108 and initiate impact ionization in the multiplication region 112.

In sharp contrast, in the traditional solutions, the effects causing avalanche process, for example, energy/momentum gain and impact ionization are effected within a same region. Carrying-out both these processes in a common region leads to randomness and generates excess noise. Advantageously, in the proposed APD 102, the photon-generated charge carriers are first accelerated in the acceleration region 108 and initiate impact ionization locally in the multiplication region 112. The localized impact ionization in the multiplication region 112 caused due to the geometry of the charge region 110 and the second contact region (described earlier), reduces randomness and, hence suppresses the excess noise. Due to reduction of the excess noise, the APD 102 is more sensitive to incoming optical signals in comparison to the traditional solutions. In other words, in some examples, an optical receiver that uses the APD 102 can sense optical signals with lower intensities comparison to the traditional solutions. Accordingly, optical transmitters may be designed to emit optical signals with reduced intensities. Therefore, in some examples, use of the APD 102 in an optical communication system may reduce a link power cost/budget.

Further, in some examples, the proposed structure of APD 102 is suitable with several semiconductor materials. For example, in comparison to impact ionization engineered APDs and the staircase APDs that uses materials with specific and/or modified band structures, the proposed APD 102 is not limited by such band structure requirements. Moreover, the proposed APD 102 may further reduce the excess noise if the multiplication region 112 is made of a low k-value material. Furthermore, the proposed structure of APD 102 can be easily applied on current silicon photonics platforms. Further, use of the acceleration region 108 in the APD 102 avoids the impact ionization to happen in the photon absorption region 106. Moreover, as noted earlier, the structures of the charge region 110 and the second contact region 116 taper toward each other leading to shorter first boundaries 122, 126 facing each other (see FIGS. 1B and 1C). Such structures of the charge region 110 and the second contact region 116, causes reduction in the electric field in the charge region 110 and the second contact region 116 and the electric field remains confined in the multiplication region 112. Such electric field distribution of the electric field reduces dark current in the APD 102.

Figure 3:
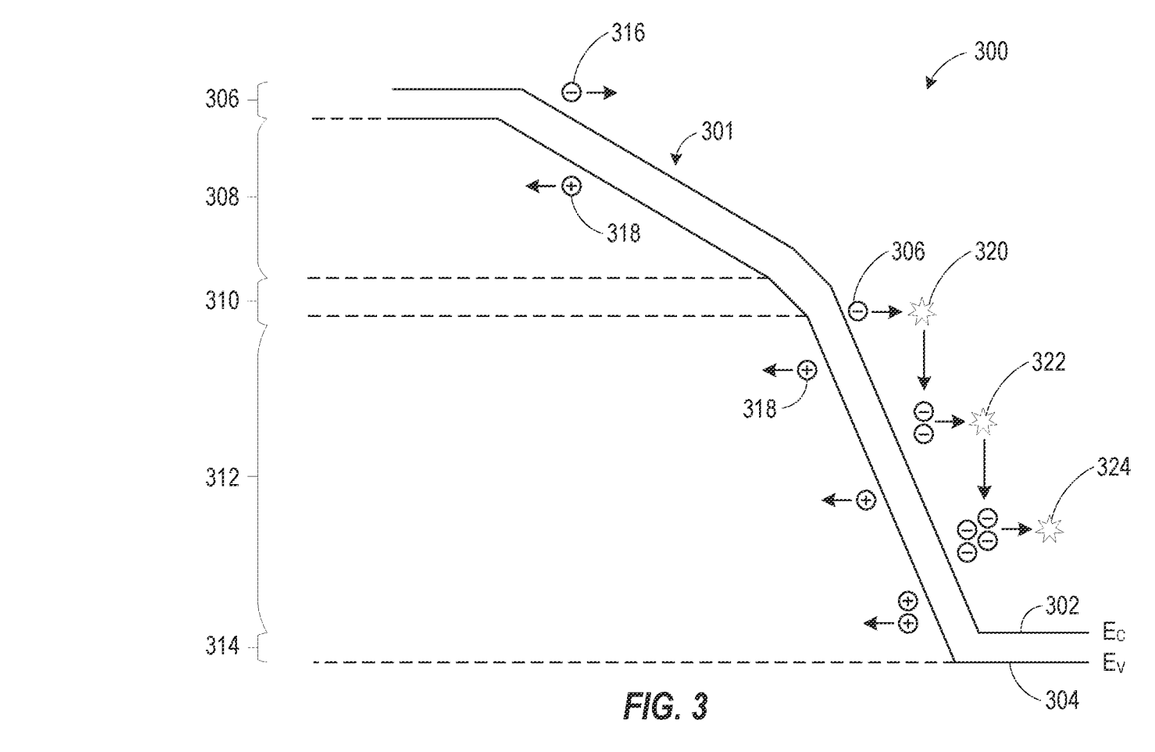
FIG. 3 depicts a graphical representation illustrating a band structure of the APD of FIG. 1A and an impact ionization in the APD, in accordance with an example.

Referring now to FIG. 3, a graphical representation 300 illustrating a band structure 301 of the APD 102 of FIG. 1A is presented, in accordance with an example. For ease of illustration, the band structure 301 shown in FIG. 3 represents an energy band lines 302 and 304 respectively representing energy levels corresponding to a conduction band and a valance band for the substrate 104 made of a low k-value material. A distance between the energy band lines 302 and 304 may represent a band gap indicative of an energy required for a charge carrier (e.g., an electron) to become free by moving from the valance band to the conduction band. During operation of the APD 102, the energy band lines 302 and 304 may have different slopes depending electric field appearing across various regions of the APD 102 and material properties (e.g., doping concentration and/or lattice structure) of the respective regions.

In the graphical representation 300, reference numerals 306, 308, 310, 312, and 314 represent energy band regions corresponding to the first contact region 114, the acceleration region 108, the charge region 110, the multiplication region 112, and the second contact region 116, respectively. As depicted in FIG. 3, in the energy band regions 306 and 314, the energy band lines 302 and 304 remain flat due to near-zero or zero electric field appearing in the contact regions 114 and 116. On the other hand, the energy band lines 302 and 304 may have highest slope in the energy band region 312 due to the highest electric field in the multiplication region 112. Further, an electron 316 and a hole 318 represent photon-generated charge carriers that have diffused into the acceleration region 108 from the photon absorption region 106. It is to be noted that, two photon-generated charge carriers (e.g., the electron 316 and hole 318) are shown for ease of illustration in FIG. 3. As will be understood, numerous such photon-generated charge carriers may diffuse into the acceleration region 108 from the photon absorption region 106 depending on the intensity of the light impinging on the APD 102.

For illustration purposes, in FIG. 3, a phenomenon of the impact ionization is described with reference to the electron 316 and hole 318 that have diffused into the acceleration region 108. The photon-generated charge carriers, e.g., the electron 316 and the hole 318 may obtain an initial momentum and be accelerated in the acceleration region 108 due to the presence of non-zero electric field in the acceleration region 108 (see FIG. 2). After gaining such initial acceleration, the electron 316 may enter into the multiplication region 112 via the charge region 110. In the presence of the high electric field in the multiplication region 112, such accelerated electron 316 may gain sufficient momentum that the electron 316 collide with other atoms in the multiplication region 112 and free-up another electron thereby leaving behind a free hole as well.

The collision of the electron 316 with an atom of material in the multiplication region 112 is represented by a starred symbol 320 and such process of generating free charge carries by way of collisions is referred to as impact ionization. The free electrons may again be energized by the high electric field in the multiplication region 112 and further collide (e.g., collisions 322 and 324) with additional atoms thereby generating additional electrons and holes as depicted in the graphical representation 300 of FIG. 3. Several such collisions may occur in the multiplication region 112 due to the high electric field of the multiplication region 112 and the energies/acceleration that the photon-generated charge carried have obtained from the acceleration region 108. Since the photon-generated charge carriers have already obtained energy in the acceleration region 108, it becomes easier for the photon-generated charge carriers to attain an ionization threshold energy in the multiplication region 112. As such, the acceleration region 108 and the charge region 110 may not have sufficient energy to effect the impact ionization therein. As a result, the impact ionization events may be concentrated in the multiplication region 112.

Figure 4:
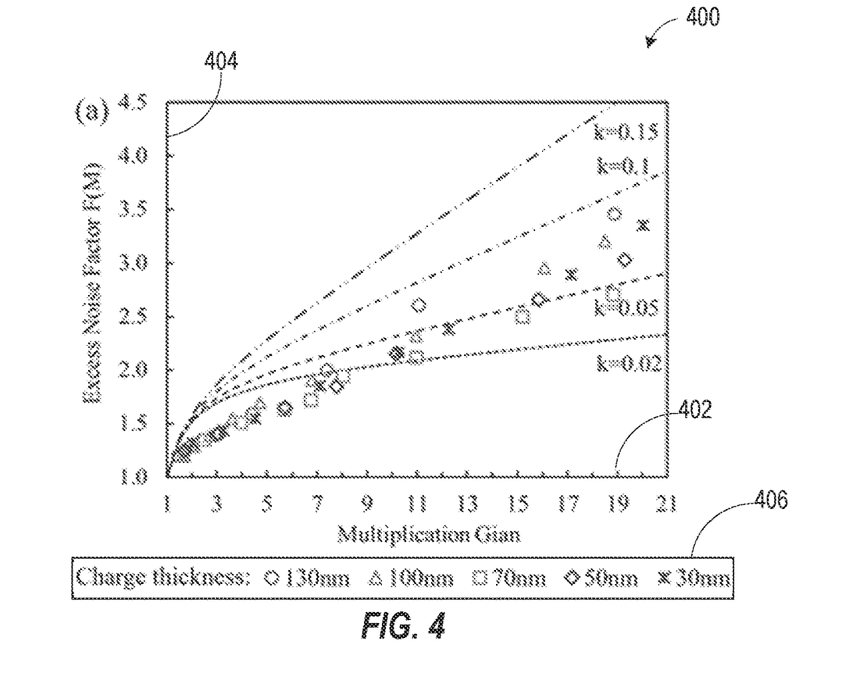
FIG. 4 depicts a graphical representation showing simulation results of excess noise versus a multiplication gain for the APD of FIG. 1A corresponding to different thicknesses of a charge region, in accordance with an example.
Figure 5:
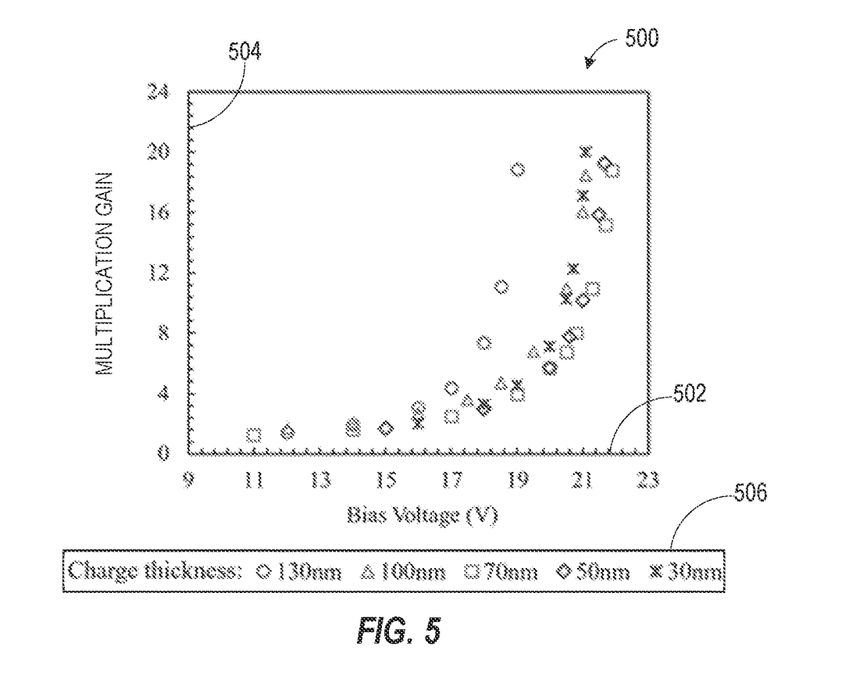
FIG. 5 depicts another graphical representation showing simulation results of a multiplication gain versus bias voltage for the APD of FIG. 1A corresponding to different thickness of a charge region, in accordance with an example.

Referring now to FIG. 4, a graphical representation 400 showing simulation results of excess noise versus gain for the APD 102 of FIG. 1 corresponding to different thicknesses of a charge region 110, in accordance with an example. Further, FIG. 5 depicts another graphical representation 500 showing simulation results of the multiplication gain versus a bias voltage for the APD 102 corresponding to different thicknesses of a charge region 110, in accordance with an example. As previously noted, the doping concentration and thickness of the charge region 110 may be adjusted to tune the electric field distribution between the acceleration region 108 and the multiplication region 112. In order to analyze these relationships, for example, a relationship between the excess noise of the APD 102 and a multiplication gain of the multiplication region 112; and the relationship between the multiplication gain versus a bias voltage for the APD 102, a Monte Carlo simulations were carried-out. During the simulations of both FIG. 4 and FIG. 5, a thickness of the acceleration region 108 and a thickness the multiplication region 112 are respectively maintained at 400 nanometer (nm) and 100 nm. In addition, to simplify the analysis, the simulations of both FIGS. 4-5 were carried out for different thicknesses (depicted in FIGS. 4-5) of the charge region 110 with the doping concentration of $2e^{17}$ cm$^{-3}$ in the charge region 110.

In the graphical representation 400 of FIG. 4, reference numerals 402 and 404 respectively represent an X-axis and a Y-axis. The X-axis 402 represents the multiplication gain and the Y-axis 404 represents an excess noise factor. The excess noise factor is a function of an average gain M of the APD 102, and a ratio k (hereinafter referred to as k-value) of an ionization coefficient of holes to an ionization coefficient of electrons for the APD 102. In some examples, the excess noise factor may be indicative of a level of the excess noise in the APD 102. Accordingly, in the graphical representation 400, measurements of the excess noise factor are plotted for different thicknesses (e.g., varying from 130 nm to 30 nm) of the charge region 110 as represented in a legend box 406. It may be observed from the graphical representation 400 that when the thickness of the charge region 110 is reduced, the excess noise decreases first and then increases again. In one example, an optimized thickness of the charge region 110 may be about 70 nm that results in an optimized overall excess noise for different values of the multiplication gain.

As can be observed from the graphical representation 400, if charge region 110 is thicker, the electric field in the acceleration region 108 may be too low to provide charge carriers (e.g., electrons) enough energy compared to losing energy from scattering. Accordingly, a much higher electric field is needed in the multiplication region 112 to effect the impact ionization. The k-value of Silicon (e.g., the material of the substrate 104) increases with the electric field so that the APD 102 may exhibit a higher excess noise. On the other hand, if charge region 110 is thinner, the electric field in the acceleration region 108 is high enough for triggering impact ionization at anywhere in the acceleration region 108 or the multiplication region 112, thus the excess noise of APD increases again. Therefore, the thickness of the charge region 110 may be suitably adjusted to achieve the electric field distribution which can cause impact ionization to occur in the multiplication region 112.

Referring now to the graphical representation 500 of FIG. 5, reference numerals 502 and 504 respectively represent an X-axis and a Y-axis. The X-axis 502 represents magnitudes of a bias voltage applied to the metal contacts 118, 120 of the APD 102 and the Y-axis 504 represents the multiplication gain. Further, a legend box 506 depicts various thicknesses of the charge region 110 used to perform the simulations. In the graphical representation 500, measurements of the multiplication gain are plotted for different magnitudes of the bias voltage of the APD 102. It may be observed from the graphical representation 500 that the APD 102 when designed to have the charge region 110 of thickness 70 nm requires highest bias voltage. The APD with thicker charge region has lower breakdown voltage because of the small voltage across the acceleration region 108. However, the APD 102 with thinner charge region 110 needs lower electric field for to achieve the same multiplication gain since as in such APD with thinner charge region 110 the impact ionization may also happen in the entire depletion region including multiplication region 112 and the charge region 110. In particular, for thinner charge region 110, the electric field in acceleration region 108 increases to have the probability of impact ionization. Since the entire depletion region has relatively high electric field due to the thinner charge region 110, there exist a longer path for impact ionization. Thus, on an average, the APD 102 with thinner charge region 110 may have a lower electric field for same multiplication gain. Consequently, a higher bias voltage may need to be supplied as a cost of the lower excess noise.

Figure 6:
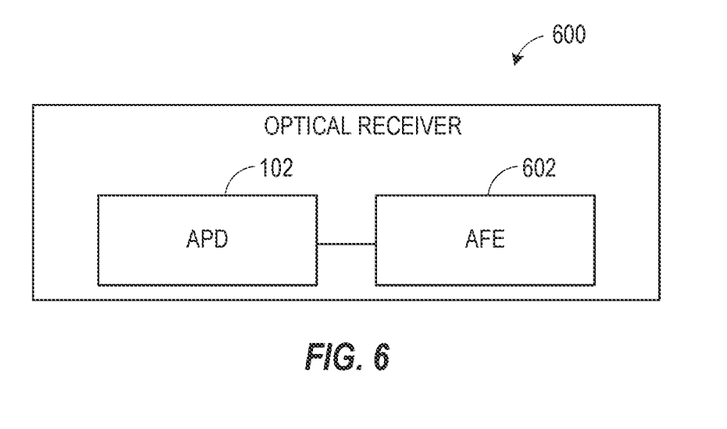
FIG. 6 depicts an optical receiver, in accordance with an example.

Moving now to FIG. 6, an optical receiver 600 is presented, in accordance with an example. In some examples, the optical receiver 600 may form a part of a larger optical communication system (not shown) or may be used as a stand-alone optical detector. The optical receiver 600 may include an APD, such as, the APD 102 and an analog front-end (AFE) 602. The AFE 602 may be coupled to the APD 102. During operation the optical receiver 600, the APD 102 may be reversed biased by applying suitable voltage to the APD 102 and the APD 102 may generate an analog current depending on an intensity of the optical signal impinging thereon. In particular, a magnitude of the analog current generated by the APD 102 is dependent on the intensity of the optical signal (i.e., light) impinging on the APD 102.

The AFE 602 may be coupled to the APD 102 to receive the analog current generated by the APD 102. The AFE 602 may convert the analog current into a digital output. The digital output of the AFE 602 may include digital states such as "0" and "1", or "high" and "low." For example, the AFE 602 may generate a digital state "1" (or "high") if the magnitude of the analog signal is greater than a predetermined threshold current. Further, the AFE 602 may generate a digital state "0" (or "low") if the magnitude of the analog signal is smaller than the predetermined threshold current. Accordingly, the AFE 602 may convert the analog current generated by the APD 102 into the digital output containing a bit stream of 0s (zeros) and 1s (ones). The AFE 602 may be implemented using several known circuits including, but not limited to, one or more of a trans-impedance amplifier, sampling circuits, a pre-amplifier, a voltage latch, or a logic latch, without limiting the scope of the present disclosure.

While certain implementations have been shown and described above, various changes in from and details may be made. For example, some features and/or functions that have been described in relation to one implementation and/or process may be related to other implementations. In other words, processes, features, components, and/or properties described in relation to one implementation may be useful in other implementations. Furthermore, it should be appreciated that the systems and methods described herein may include various combinations and/or sub-combinations of the components and/or features of the different implementations described. Moreover, method blocks described in various methods may be performed in series, parallel, or a combination thereof. Further, the method blocks may as well be performed in a different order than depicted in flow diagrams.

Further, in the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. An avalanche photodiode (APD) comprising:
a substrate comprising semiconductor material; and
a photon absorption region disposed on the substrate, the substrate comprising:
a charge carrier acceleration region under the photon absorption region;
a charge region adjacent to the charge carrier acceleration region;
a charge carrier multiplication region adjacent to the charge region, wherein the charge carrier acceleration region, the charge region, and the charge carrier multiplication region are laterally formed in the substrate;
a first contact region adjacent to the charge carrier acceleration region and comprising a first-type doping; and
a second contact region adjacent to the charge carrier multiplication region and comprising a second-type doping, wherein the charge region comprises either the first-type doping or the second-type doping, and wherein a boundary of the charge region and a boundary of the second contact region that are oriented toward each other are shorter than respective opposite boundaries of the charge region and the second contact region.

2. The APD of claim 1, wherein when a biasing voltage is applied to the APD, photon-generated free charge carriers are generated in the photon absorption region and are diffused into the charge carrier acceleration region, and wherein the charge carrier acceleration region is configured to accelerate the photon-generated free charge carriers prior to the photon-generated free charge carriers entering into the charge region and undergoing impact ionization in the charge carrier multiplication region.

3. The APD of claim 2, wherein, under the application of the biasing voltage, an electric field across the charge carrier multiplication region is higher than an electric field across the charge carrier acceleration region.

4. The APD of claim 1, wherein the first-type doping is a p-type doping and the second-type doping is an n-type doping.

5. The APD of claim 1, wherein the first-type doping is an n-type doping and the second-type doping is a p-type doping.

6. The APD of claim 1, wherein the substrate comprises a first semiconductor material and the photon absorption region comprises a second semiconductor material different from the first semiconductor material.

7. The APD of claim 6, wherein the first semiconductor material comprises one of Silicon (Si), Indium phosphide (InP), Indium aluminum arsenide (InAlAs), or Aluminum gallium arsenide (AlGaAs), and wherein the second semiconductor material comprises one of Indium gallium arsenide (InGaAs), Germanium (Ge), or Gallium arsenide (GaAs), or Silicon (Si).

8. The APD of claim 6, wherein the first semiconductor material has a wider energy bandgap in comparison to an energy bandgap of the second semiconductor material so that under application of a biasing voltage, there exists a non-zero electric field across the charge carrier acceleration region.

9. The APD of claim 1, wherein the charge carrier acceleration region and the charge carrier multiplication region are un-doped.

10. The APD of claim 1, wherein a thickness of the charge region is in a range from about 30 nm to 130 nm.

11. The APD of claim 1, wherein a thickness of the charge region is 70 nm.

12. An optical receiver comprising:
an avalanche photodiode (APD) to convert an incoming optical signal into an analog current, the APD comprising:
a substrate comprising semiconductor material; and
a photon absorption region disposed on the substrate, the substrate comprising:
a charge carrier acceleration region under the photon absorption region;
a charge region adjacent to the charge carrier acceleration region;
a charge carrier multiplication region adjacent to the charge region, wherein the charge carrier acceleration region, the charge region, and the charge carrier multiplication region are laterally formed in the substrate;
a first contact region adjacent to the charge carrier acceleration region and comprising a first-type doping; and
a second contact region adjacent to the charge carrier multiplication region and comprising a second-type doping, wherein the charge region comprises either the first-type doping or the second-type doping, and wherein a boundary of the charge region and a boundary of the second contact region that are oriented toward each other are shorter than respective opposite boundaries of the charge region and the second contact region; and
an analog front-end (AFE) coupled to the APD to receive the analog current generated by the APD.

13. The optical receiver of claim 12, wherein when a biasing voltage is applied to the APD, photon-generated free charge carriers are generated in the photon absorption region and are diffused into the charge carrier acceleration region, and wherein the charge carrier acceleration region is configured to accelerate the photon-generated free charge carriers prior to the photon-generated free charge carriers entering into the charge region and undergoing impact ionization in the charge carrier multiplication region.

14. The optical receiver of claim 13, wherein, under the application of the biasing voltage, an electric field across the charge carrier multiplication region is higher than an electric field across the charge carrier acceleration region.

15. The optical receiver of claim 12, wherein the substrate comprises a first semiconductor material and the photon absorption region comprises a second semiconductor material different from the first semiconductor material.

16. The optical receiver of claim 15, wherein the first semiconductor material has a wider energy bandgap in comparison to an energy bandgap of the second semiconductor material.

17. The optical receiver of claim 16, wherein, under application of a biasing voltage, there exists a non-zero electric field across the charge carrier acceleration region.

18. The optical receiver of claim 12, wherein the charge carrier acceleration region and the charge carrier multiplication region are un-doped.

19. The optical receiver of claim 12, wherein a thickness of the charge region is suitably selected to achieve an electric field distribution which can cause impact ionization to occur in the charge carrier multiplication region thereby reducing excess noise.

20. The optical receiver of claim 12, wherein a width of the charge carrier acceleration region is same as a width of the photon absorption region.

* * * * *